United States Patent
Van Kampen et al.

(10) Patent No.: US 10,163,566 B2
(45) Date of Patent: Dec. 25, 2018

(54) DVC UTILIZING MIMS IN THE ANCHOR

(71) Applicant: CAVENDISH KINETICS, INC., San Jose, CA (US)

(72) Inventors: Robertus Petrus Van Kampen, S-Hertogenbosch (NL); Roberto Gaddi, Rosmalen (NL); Richard L. Knipe, McKinney, TX (US)

(73) Assignee: CAVENDISH KINETICS, INC., San Jose, CA (US)

( * ) Notice: Subject to any disclaimer, the term of this patent is extended or adjusted under 35 U.S.C. 154(b) by 0 days.

(21) Appl. No.: 15/548,992

(22) PCT Filed: Jan. 28, 2016

(86) PCT No.: PCT/US2016/015360
§ 371 (c)(1),
(2) Date: Aug. 4, 2017

(87) PCT Pub. No.: WO2016/126517
PCT Pub. Date: Aug. 11, 2016

(65) Prior Publication Data
US 2018/0033553 A1     Feb. 1, 2018

Related U.S. Application Data

(60) Provisional application No. 62/112,217, filed on Feb. 5, 2015.

(51) Int. Cl.
*H01H 59/00*     (2006.01)
*H01G 5/16*     (2006.01)
(Continued)

(52) U.S. Cl.
CPC .......... *H01G 4/005* (2013.01); *H01H 1/0036* (2013.01); *H01H 59/0009* (2013.01);
(Continued)

(58) Field of Classification Search
CPC .................................. H01G 5/16; H01G 5/18
See application file for complete search history.

(56) References Cited

U.S. PATENT DOCUMENTS

2005/0248423 A1   11/2005   Qian et al.
2007/0278075 A1   12/2007   Terano et al.
(Continued)

FOREIGN PATENT DOCUMENTS

CN     1601685 A     3/2005
CN     1922755 A     2/2007
(Continued)

OTHER PUBLICATIONS

Office Action issued in corresponding Chinese Patent Application No. 201680014343.0, dated Aug. 3, 2018 (16 pages).

*Primary Examiner* — Eric W Thomas
(74) *Attorney, Agent, or Firm* — Patterson & Sheridan, LLP; Steven Versteeg (57) ABSTRACT

The present disclosure generally relates to a MEMS DVC utilizing one or more MIM capacitors located in the anchor of the DVC and an Ohmic contact located on the RF-electrode. The MIM capacitor in combination with the ohmic MEMS device ensures that a stable capacitance for the MEMS DVC is achieved with applied RF power.

17 Claims, 12 Drawing Sheets

(51) Int. Cl.
    *H01G 4/005*     (2006.01)
    *H01H 1/00*      (2006.01)
(52) U.S. Cl.
    CPC ............... *B81B 2201/016* (2013.01); *H01H 2001/0057* (2013.01); *H01H 2001/0084* (2013.01)

(56) References Cited

U.S. PATENT DOCUMENTS

| | | | |
|---|---|---|---|
| 2010/0116632 A1* | 5/2010 | Smith | B81B 7/04 200/181 |
| 2010/0254068 A1* | 10/2010 | Shimanouchi | H01G 5/011 361/278 |
| 2011/0314669 A1 | 12/2011 | Stamper et al. | |
| 2011/0316098 A1 | 12/2011 | Dunbar, III et al. | |
| 2014/0300404 A1 | 10/2014 | Gaddi et al. | |
| 2016/0172112 A1 | 6/2016 | Knipe et al. | |

FOREIGN PATENT DOCUMENTS

| | | |
|---|---|---|
| CN | 102295263 A | 12/2011 |
| CN | 103843090 A | 6/2014 |
| CN | 104037027 A | 9/2014 |
| CN | 105556635 A | 5/2016 |
| WO | 2013/033613 A2 | 3/2013 |

* cited by examiner

DVC UTILIZING MIMS IN THE ANCHOR

BACKGROUND OF THE DISCLOSURE

Field of the Disclosure

Embodiments of the present disclosure generally relate to a radio frequency (RF) digital variable capacitor (DVC) units for RF tuning and impedance matching.

Description of the Related Art

MEMS capacitors can show non linear behavior when operated as a capacitor. This is a problem for RF applications when signals transmitted at one frequency can leak into other frequency channels. One measure of this is the IP3value or the value of input at which the third order nonlinearity times the input voltage or current is equal to the first order term times the input voltage or current.

With a MEMS capacitor, as the power increases on the RF line, an increasing voltage is dropped across the oxide between the RF line and the MEMS cantilever. Even though the MEMS device may be in mechanical contact with the oxide layer, any roughness or asperities at that interface can result in a small change in the gap (between the RF electrode and the MEMS device) as a function of applied power. This change in gap results in a change in the maximum capacitance as a function of power. Thus a modulation in power can then lead to a modulation in frequency and to more signals being found outside the desired frequency window.

Therefore, there is a need in the art for a MEMS DVC with a stable capacitance vs RF input power.

SUMMARY OF THE DISCLOSURE

The present disclosure generally relates to a MEMS DVC utilizing one or more MIM capacitors. The MIM capacitor may be integrated into the MEMS device itself and may be disposed on the anchor of the MEMS device.

In one embodiment, a DVC comprises a substrate having at least one RF electrode and at least one anchor electrode disposed therein; an insulating layer disposed on the at least one anchor electrode; a conductive layer disposed on the insulating layer, wherein the at least one anchor electrode, insulating layer and conductive layer form a MIM capacitor; at least one MEMS bridge disposed over the substrate and coupled to the conductive layer, the at least one MEMS bridge movable from a position spaced a first distance from the RF electrode and a position spaced a second distance from the RF electrode that is less than the first distance.

In another embodiment, a method of making a DVC comprises forming a plurality of electrodes over a substrate, wherein at least one electrode is an anchor electrode and at least one electrode is an RF electrode; depositing an insulating layer over the plurality of electrodes; removing at least a portion of the insulating layer to expose at least a portion of the RF electrode; depositing a conductive layer over the insulating layer and exposed RF electrode; removing selected portions of the conductive layer; forming an ohmic contact over a portion of the conductive layer; forming a MEMS bridge in contact with the ohmic contact.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to a MEMS DVC utilizing one or more MIM capacitors. The MIM capacitor may be disposed on the anchor of the MEMS device.

In this disclosure, the MEMS variable capacitor is converted into a resistive switch which then switches in a metal insulator metal (MIM) capacitor with conformal coatings of insulator and then metal over the first metal. Such a capacitor is more robust to high voltages and the high mechanical pressures induced by the voltage drop across the insulator, because the forces are evenly distributed over the interfaces. With the MEMS acting as a resistive switch, a low resistance is needed to get a good value for Q. To achieve a low resistance one normally requires a large MEMS device that can apply large forces to the contacts. The problem with a large MEMS device is that it switches slowly. Also each MEMS switch needs to be able to sustain the current through the MIM capacitor. With large values of the MIM capacitor, the current through the MEMS-switch can become very high which is a potential reliability issue. To avoid this, many small MEMS devices in parallel can be used. Each MEMS device connects to a small MIM capacitor and only needs to supply a limited current. Although each contact has a reasonably large resistance, the total combined value of all parallel devices is small.

Figure 1:
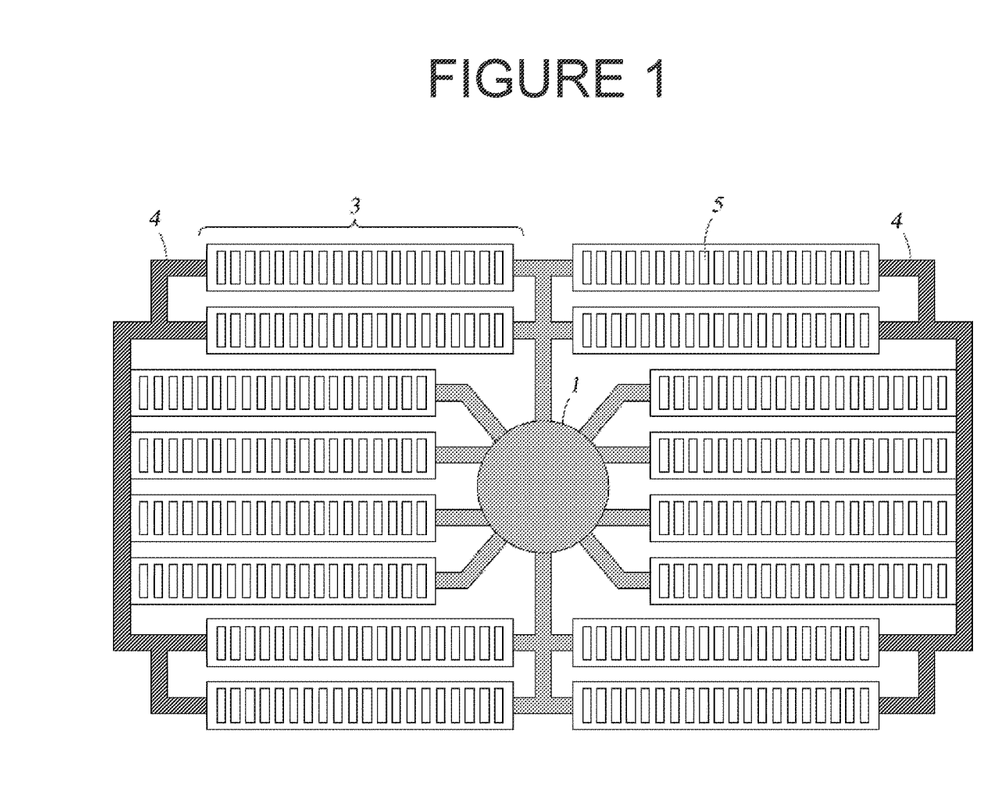
FIG. 1 is a schematic top view of a MEMS DVC according to one embodiment.

FIG. 1 shows a possible implementation of the resistively switched digital variable capacitor shown from the top. It contains an array of small hybrid Ohmic-MIM cells 3. The RF connections 1 and 4 to each cell are on opposite ends. Each cell contains an array of (5 to 40) small Ohmic-MIM switches 5 working in parallel. All switches 5 in a single cell 3 are actuated at the same time and provide a minimum capacitance when turned off or a maximum capacitance when turned on. Multiple cells can be grouped to result in a binary control-scheme so that the total capacitance between the RF connections 1 and 4 can be tuned with a digital control of 1 to 8 bits resolution.

Figure 2A:
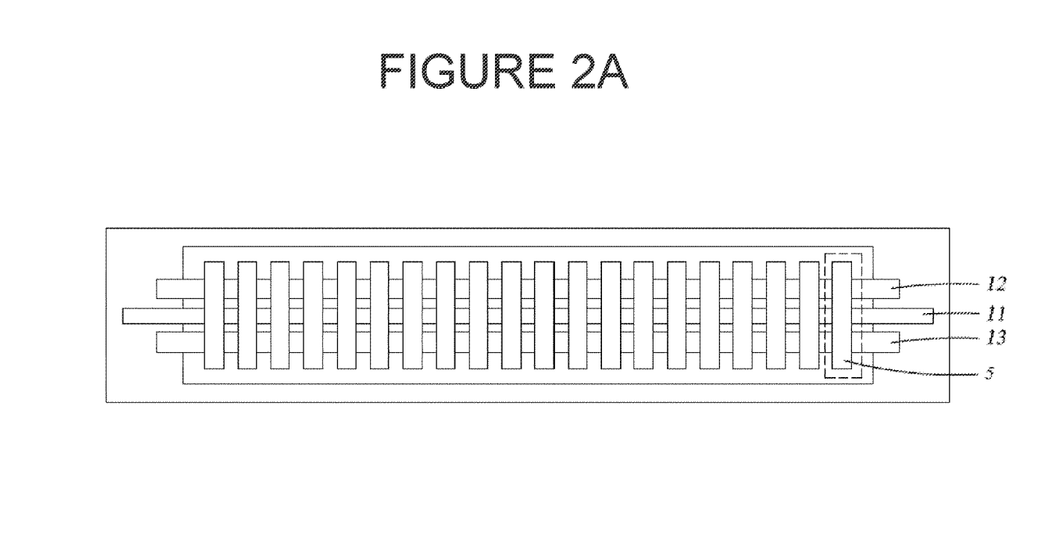
FIGS. 2A and 2B are schematic top and cross-sectional illustrations of the MEMS device of the MEMS DVC of FIG. 1.

FIG. 2A shows the top view of the Ohmic-MIM cell marked as 3 in FIG. 1. The cell contains an array of Ohmic-MIM switches 5. Underneath the switches there is an RF electrode 11 and pull-in electrodes 12 and 13 to actuate the switches to the down-position (switch closed).

Figure 2B:
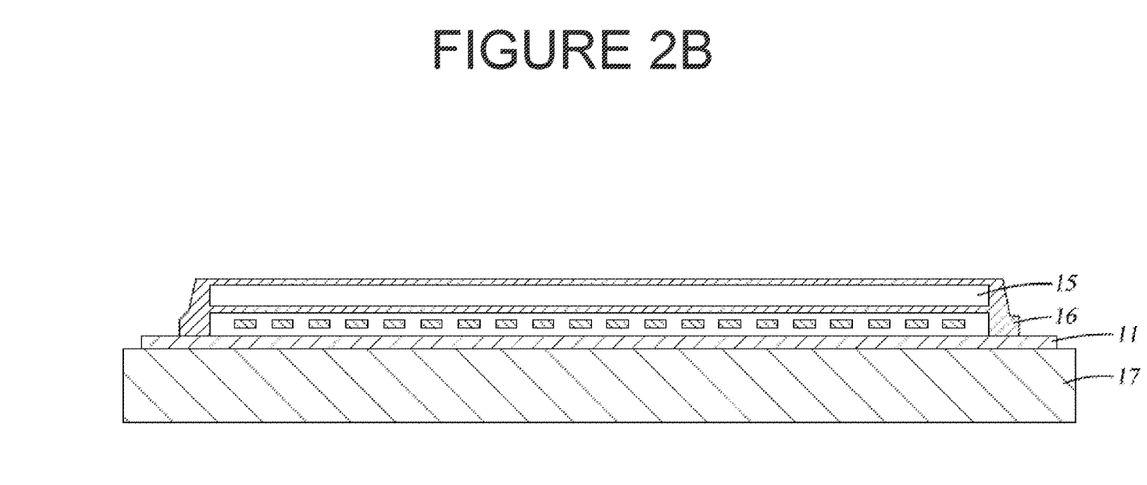

FIG. 2B shows the side view with pull up electrode 15 to actuate the switches to the up-position (switch open), cavity 16 and underlying substrate layer 17. The substrate can contain multiple metal levels for interconnect and also CMOS active circuitry to operate the device.

Figure 3A:
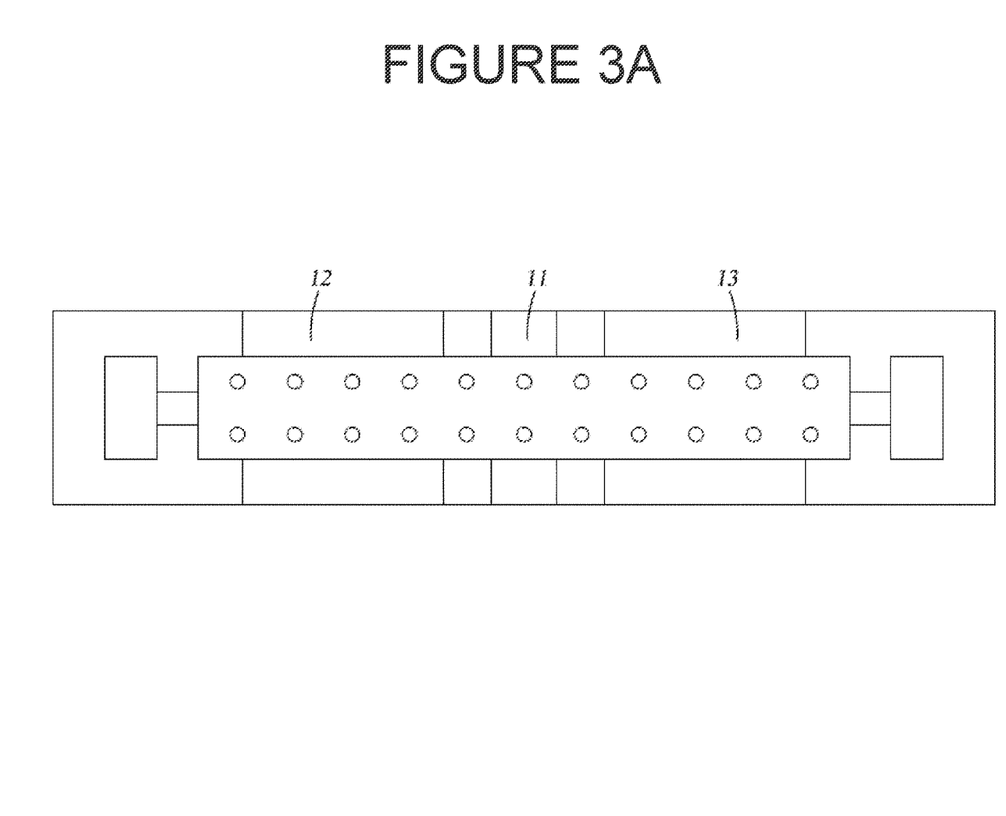
FIGS. 3A, 3B and 3C are schematic top and cross-sectional illustrations of an individual switching element in the MEMS device of the MEMS DVC of FIG. 1.

FIG. 3A shows a top view of one of the switches in the array marked as 5 in FIGS. 1 and 2A. The pull-in electrodes are marked with 12 and 13 and the RF-electrode is marked with 11.

Figure 3B:
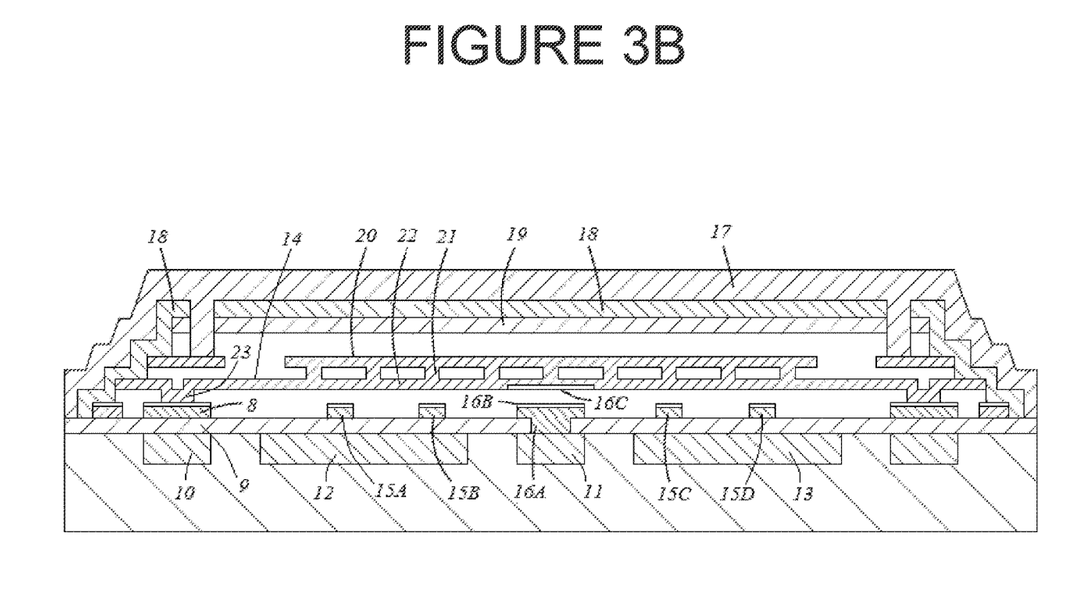

FIG. 3B shows a cross-section view of the switch. The switch element contains a stiff bridge consisting of conductive layers 20, 22 which are joined together using an array of vias 21. Layer 20 may not extend all the way to the end of the structure, making layer 20 shorter in length than layer 22. The MEMS bridge is suspended by legs 14 formed in the lower layer 22 of the MEMS bridge and anchored with via 23 onto conductor 8. This allows for a stiff plate-section and compliant legs to provide a high contact-force while keeping the operating voltage to acceptable levels. Conductors 8 and 10 together with dielectric layer 9 form a Metal-Insulator-Metal (MIM) capacitor. The MEMS bridge is connected to the top-metal 8 of the MIM-capacitor through the anchor vias 23. This scheme allows to set the maximum on-capacitance of the switch by sizing the MIM capacitor in the anchor accordingly. The off-capacitance of the switch is dominated by the dimensions of the small RF electrode 11 and is to a large degree independent of the maximum capacitance set by the MIM.

Landing post 16 is conductive and makes contact with the conducting underside of the cantilever. 16B is a surface material on the conducting post that provides good conductivity, low reactivity to the ambient materials and high melting temperature and hardness for long lifetime. Although not shown in these figures, there may be an insulating layer over the top and underside of the conductive layers 20, 22. A hole can be made in the insulator on the underside of layer 22 in the landing post area to expose a conducting region 16C for the conducting post to make electrical contact with when the MEMS is pulled down. Typical materials used for the contacting layers 16, 16B, 16C include Ti, TiN, TiAl, TiAlN, AlN, Al, W, Pt, Ir, Rh, Ru, RuO$_2$, ITO and Mo and combinations thereof. In the actuated down state layer 22 of the MEMS bridge may land on multiple bumps 15A, 15B, 15C and 15D, which are provided to avoid landing the MEMS bridge on the dielectric layer 9 above the pull-in electrodes 12, 13 which can lead to reliability issues. These bumps are generated at the same time as the top-plate 8 of the MIM capacitor and landing post 16B, 16C.

Above the MEMS bridge there is a dielectric layer 19 which is capped with metal 18 which is used to pull the MEMS up to the roof for the off state. Dielectric layer 19 avoids a short-circuit between the MEMS bridge and the pull-up electrode in the actuated-up state and limits the electric fields for high reliability. Moving the device to the top helps reduce the capacitance of the switch in the off state. The cavity is sealed with dielectric layer 17 which fills the etch holes used to remove the sacrificial layers. It enters these holes and helps support the ends of the cantilevers, while also sealing the cavity so that there is a low pressure environment in the cavities.

Figure 3C:
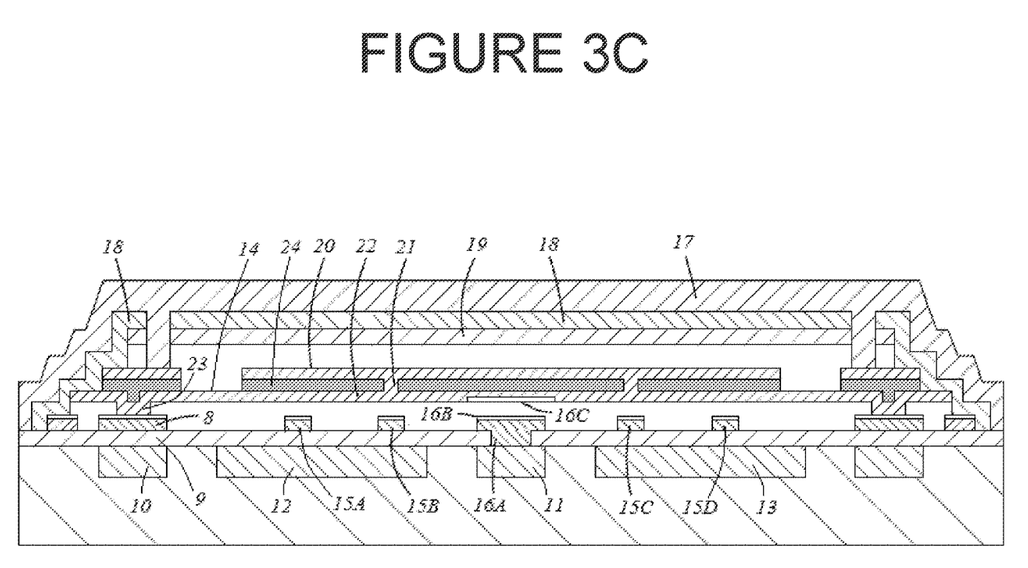

FIG. 3C shows an alternative embodiment of the switch, where the MEMS bridge consists of two layers 20, 22 which are joined together with an intermediate dielectric layer 24 and some vias 21 to electrically connect layer 20 and 22. Suitable materials for the dielectric layer 24 include silicon based materials including silicon-oxide, silicon-dioxide, silicon-nitride and silicon-oxynitride. The legs 14 are again defined in the lower layer 22 of the MEMS bridge. This allows for a stiff plate-section and compliant legs to provide a high contact-force while keeping the operating voltage to acceptable levels.

There are several advantages in implementing the full device with a large number of small ohmic-MIM switches. In general, breaking up the device in a large number of branches each one made of an ohmic switch with a very small MIM capacitor in series relaxes the requirements for the ohmic resistance value of each switch in order to achieve an overall small equivalent series resistance (ESR) and high device Q factor. Also only a small RF current will flow through each switch for a given rms voltage, because the small MIM capacitors limit the current through each switch, which minimizes reliability issues. Additionally, positioning the small MIM-capacitors in the anchor of the ohmic switch allows to size the maximum capacitance of the switch in the closed-state to a large degree independent of the minimum-capacitance in the open-state.

Figure 4:
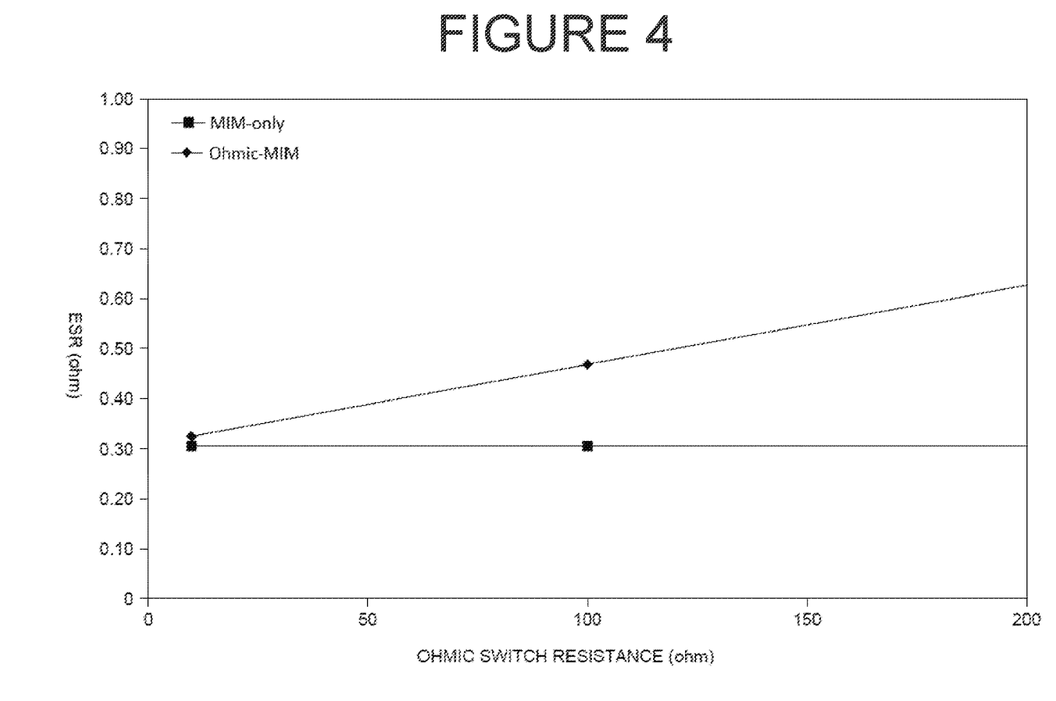
FIG. 4 is a graph comparing the resistance for the MEMS DVC of FIG. 1 and a fixed MIM-cap.

FIG. 4 is a plot generated by a simulated analysis comparing an device implemented by just MIM capacitors (therefore of fixed capacitance value) with a device which introduces ohmic switches in series to all MIM capacitors in order to obtain a programmable C value; the device ESR of the MIM capacitors is 0.3 ohm, adding the ohmic switches increases the ESR, but in order to have an ESR penalty of less than 0.1 ohm it is sufficient to have each ohmic switch resistance to be below 60 ohms; this is taking advantage of the parallelization in the architecture made of a large number of very small ohmic-MIM switches.

MEMS DVC Fabrication

Figure 5A:
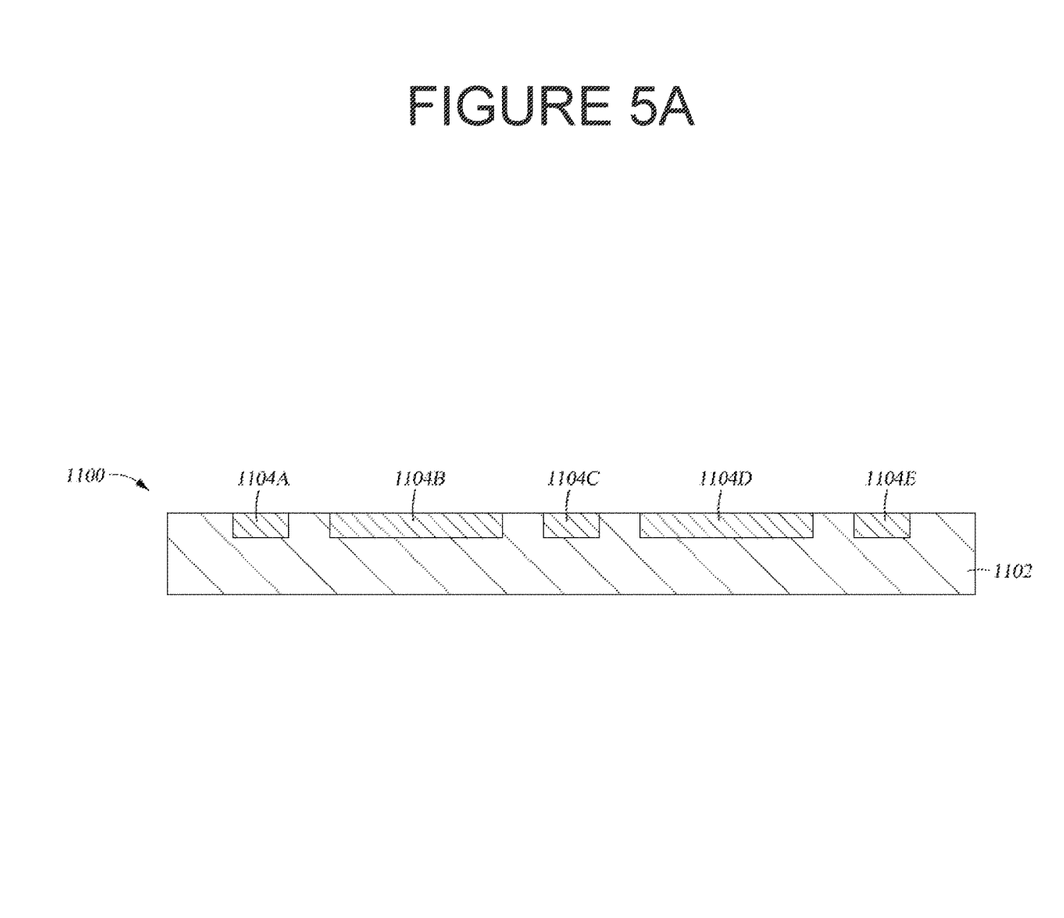
FIGS. 5A-5E are schematic illustrations of a MEMS DVC at various stages of fabrication according to one embodiment.

FIGS. 5A-5D are schematic illustrations of a MEMS DVC 1100 at various stages of fabrication according to one embodiment. As shown in FIG. 5A, the substrate 1102 has a plurality of electrodes 1104A-1104E formed therein. Electrodes 1104A, 1104E will form the bottom metal of the MIM capacitor, electrodes 1104B, 1104D will form the pull-in electrodes and electrode 1104C will form the RF electrode.

It is to be understood that the substrate 1102 may comprise a single layer substrate or a multi layer substrate such as a CMOS substrate having one or more layers of interconnects. Additionally, suitable material that may be used for the electrodes 1104A-1104E include titanium-nitride, aluminum, tungsten, copper, titanium, and combinations thereof including multi-layer stacks of different material.

Figure 5B:
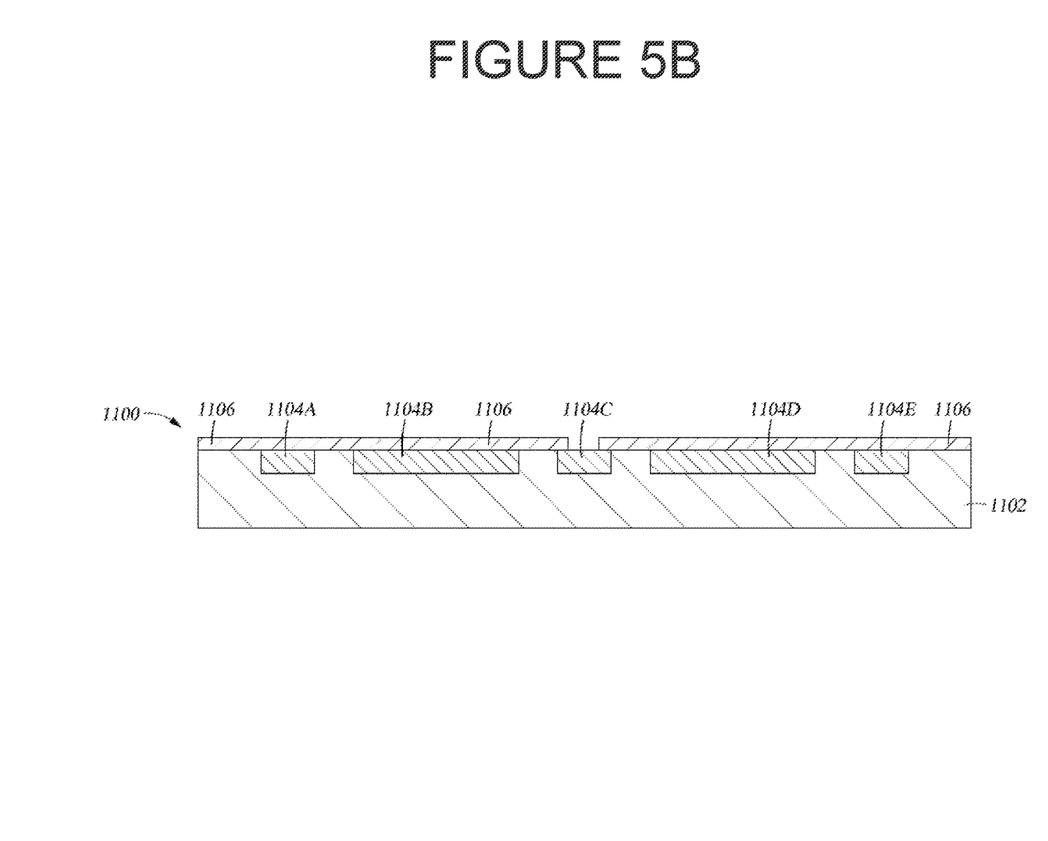

As shown in FIG. 5B, an electrically insulating layer 1106 is then deposited over the electrodes 1104A-1104E. Suitable materials for the electrically insulating layer 1106 include silicon based materials including silicon-oxide, silicon-dioxide, silicon-nitride and silicon-oxynitride. As shown in FIG. 5B, the electrically insulating layer 1106 is removed over the RF electrode 1104C to expose the underlying electrode 1104C.

Figure 5C:
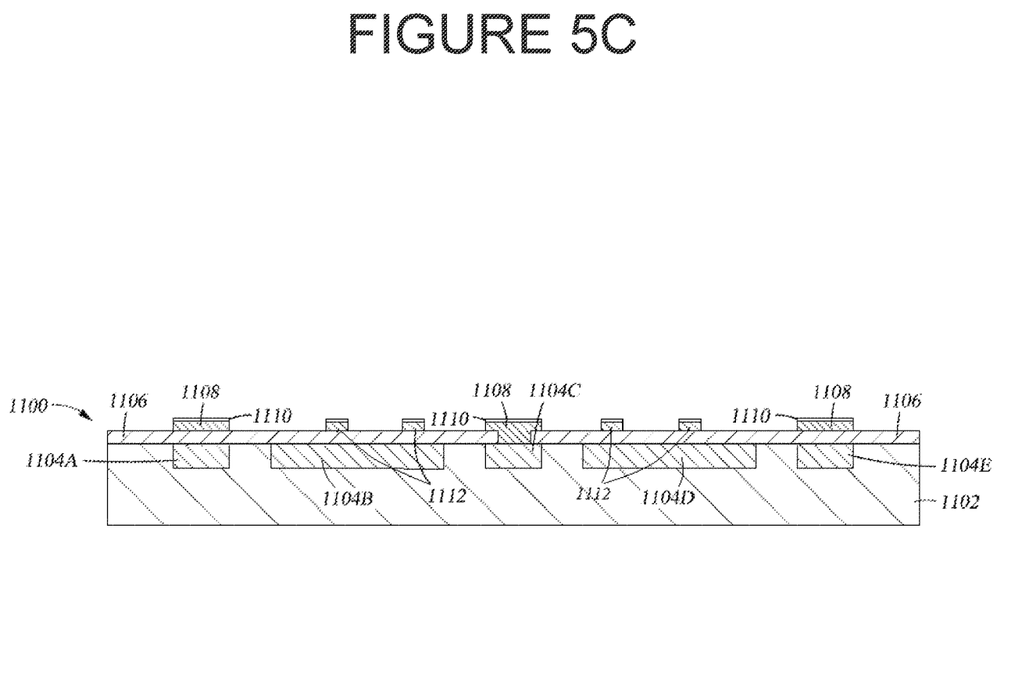
Figure 5D:
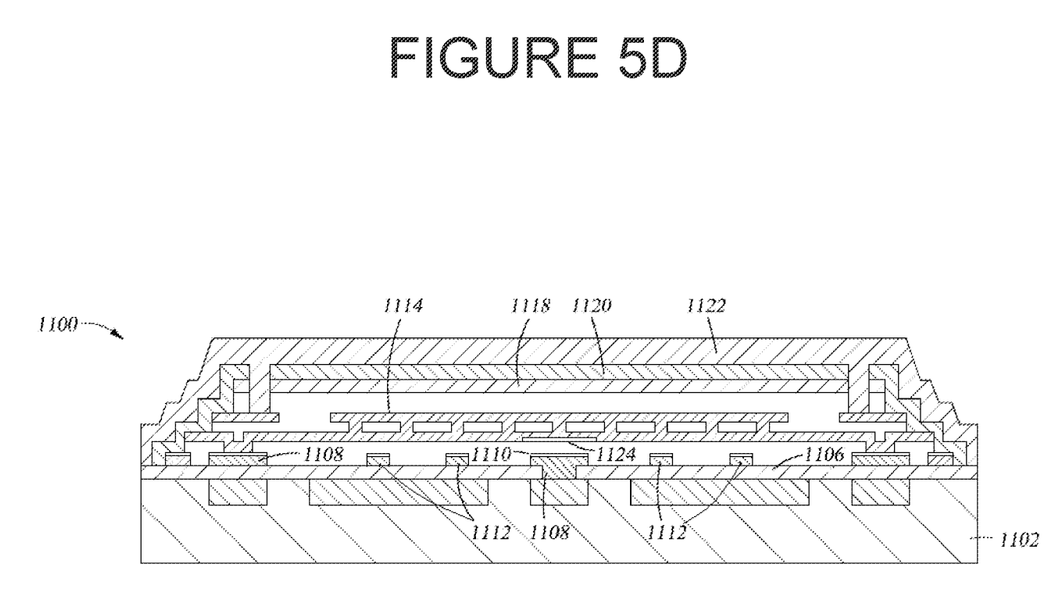

Electrically conductive material 1108 may then be deposited over the electrically insulating layer 1106 as shown in FIG. 5C. The electrically conductive material 1108 provides the direct electrical connection to the RF electrode 1104C. Additionally, the electrically conductive material 1108 provides the upper "metal" in the MIM capacitors located above electrodes 1104A, 1104E. Suitable materials that may be used for the electrically conductive material 1108 include titanium, titanium nitride, tungsten, aluminum, combinations thereof and multilayer stacks that include different material layers. On top of conductive material 1108 a thin layer of conductive contact material 1110 is deposited which will provide the Ohmic contact to the MEMS bridge in the landed-down state. Suitable materials that may be used for the electrically conductive contact material 1110 include W, Pt, Ir, Rh, Ru, RuO$_2$, ITO and Mo.

During patterning of the electrically conductive materials 1108, 1110 also multiple electrically isolated bumps 1112 can be formed over the electrically insulating layer 1106. These provide additional mechanical support to the plate in the actuated-down state. Once the electrically conductive materials 1108, 1110 have been patterned, the remainder of the processing may occur to form the MEMS DVC 1100 shown in FIG. 5D or the alternative embodiment in FIG. 5E which uses a dielectric stiffener 1125 between the 2 plates of the MEMS bridge.

Figure 5E:
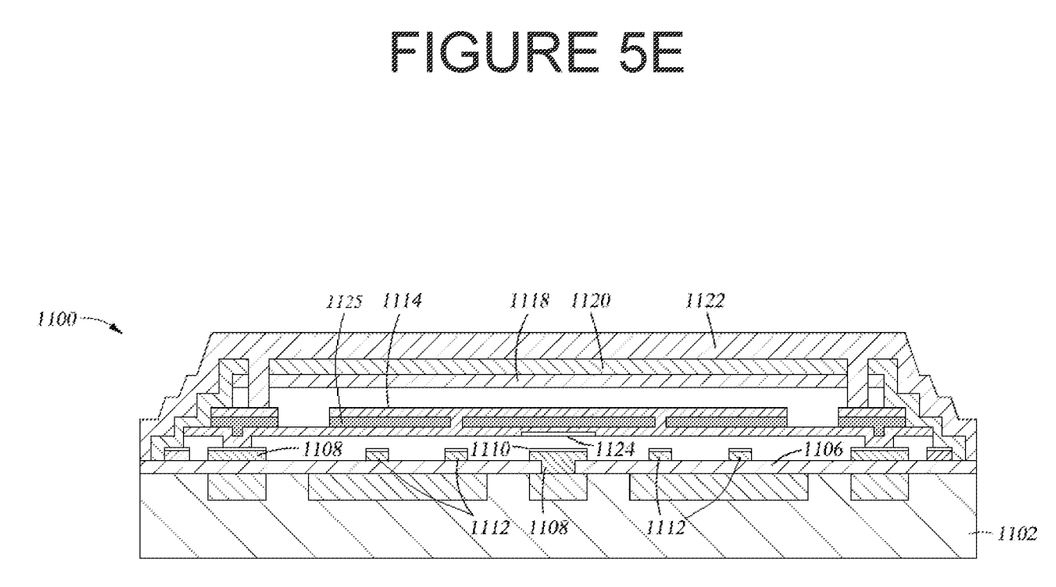

As noted above, the switching element 1114 may have insulating material coating the bottom surface thereof and thus, an area 1124 of exposed conductive material may be present that will land on the surface material 1110. An additional electrically insulating layer 1118 may be formed over the pull-off (i.e., pull-up) electrode 1120, and a sealing layer 1122 may seal the entire MEMS device such that the switching element 1114 is disposed within a cavity. During fabrication, sacrificial material is used to define the boundary of the cavity.

While the foregoing is directed to embodiments of the present disclosure, other and further embodiments of the disclosure may be devised without departing from the basic scope thereof, and the scope thereof is determined by the claims that follow.

The invention claimed is:

1. A DVC, comprising:
   a substrate having at least one RF electrode and at least one anchor electrode disposed therein;
   an insulating layer disposed on the at least one anchor electrode;
   a conductive layer disposed on the insulating layer, wherein the at least one anchor electrode, insulating layer and conductive layer form a MIM capacitor; and
   at least one MEMS bridge disposed over the substrate and coupled to the conductive layer, the at least one MEMS bridge movable from a position spaced a first distance from the RF electrode and a position spaced a second distance from the RF electrode that is less than the first distance, further comprising an ohmic contact layer disposed on the conductive layer.

2. The DVC of claim 1, wherein the at least one MEMS bridge is coupled to the ohmic contact layer.

3. The DVC of claim 2, wherein the insulating layer is at least partially disposed on the RF electrode.

4. The DVC of claim 3, wherein at least a portion of the conductive layer is disposed on the RF electrode.

5. The DVC of claim 4, wherein the ohmic contact layer comprises a material selected from the group consisting of W, Pt, Ir, Rh, Ru, RuO$_2$, ITO and Mo.

6. The DVC of claim 1, wherein the at least one anchor electrode comprises two anchor electrodes.

7. The DVC of claim 6, wherein each anchor electrode has at least a portion of the insulating layer disposed thereon.

8. The DVC of claim 7, wherein at least a portion of the conductive layer is disposed on each anchor electrode.

9. The DVC of claim 1, wherein the at least one MEMS bridge comprises a plurality of MEMS bridge and wherein each MEMS bridge is coupled to the at least one anchor electrode.

10. The DVC of claim 9, wherein each MEMS bridge is coupled to a distinct conductive layer.

11. A method of making a DVC, comprising:
    forming a plurality of electrodes over a substrate, wherein at least one electrode is an anchor electrode and at least one electrode is an RF electrode;
    depositing an insulating layer over the plurality of electrodes;
    removing at least a portion of the insulating layer to expose at least a portion of the RF electrode;
    depositing a conductive layer over the insulating layer and exposed RF electrode;
    removing selected portions of the conductive layer;
    forming an ohmic contact over a portion of the conductive layer; and
    forming a MEMS bridge in contact with the ohmic contact.

12. The method of claim 11, wherein the MEMS bridge is spaced from the RF electrode.

13. The method of claim 12, wherein a first portion of the ohmic contact is disposed on the conductive layer that is in contact with the RF electrode.

14. The method of claim 13, wherein MEMS bridge is spaced from the first portion of the ohmic contact.

15. The method of claim 14, wherein a second portion of the ohmic contact is disposed on the insulating layer.

16. The method of claim 15, wherein the MEMS bridge is in contact with the second portion of the ohmic contact.

17. The method of claim 16, wherein the ohmic contact comprises a material selected from the group consisting of W, Pt, Ir, Rh, Ru, RuO$_2$, ITO and Mo.

* * * * *